United States Patent [19]
Kaplan

[11] 4,355,341
[45] Oct. 19, 1982

[54] POWER PROTECTION CIRCUIT FOR TRANSISTORS

[75] Inventor: Leonard A. Kaplan, Fords, N.J.

[73] Assignee: RCA Corporation, New York, N.Y.

[21] Appl. No.: 164,347

[22] Filed: Jun. 30, 1980

[51] Int. Cl.³ .......................... H02H 3/26; H02H 7/20
[52] U.S. Cl. ........................................ 361/79; 361/86; 330/207 P; 330/298
[58] Field of Search ............................ 361/79, 78, 86; 330/207 P, 298, 257, 288, 51, 95, 102, 105

[56] References Cited

U.S. PATENT DOCUMENTS

| | | | |
|---|---|---|---|
| 3,577,035 | 5/1971 | Constable | 361/79 |
| 3,727,148 | 4/1973 | Carver | 330/207 P |
| 3,792,316 | 2/1974 | Bondini et al. | 361/79 |
| 3,904,979 | 9/1975 | Suzuki | 361/79 |
| 4,074,334 | 2/1978 | D'Arrigo et al. | 361/79 |

*Primary Examiner*—Patrick R. Salce
*Attorney, Agent, or Firm*—E. M. Whitacre; P. J. Rasmussen; P. M. Emanuel

[57] ABSTRACT

A protection circuit which may be used, for example, in an audio amplifier to protect the output drive transistor against conditions of excessive power dissipation. The circuit includes apparatus for monitoring the product of output current and output voltage across the protected transistor and applying a feedback signal to reduce the power dissipation if a predetermined limit is exceeded. Specifically, a representation of the product of the output voltage and output current is obtained by providing a current proportional to each and passing such current through a respective semiconductor junction to produce a logarithmically related voltage. The logarithm of the power product is obtained by summing the logarithmic voltages developed across each respective semiconductor junction.

9 Claims, 4 Drawing Figures

POWER PROTECTION CIRCUIT FOR TRANSISTORS

FIELD OF THE INVENTION

This invention relates to circuits for limiting power dissipation in transistors.

BACKGROUND OF THE INVENTION

It is often desirable to limit the power dissipation in an output transistor in order to protect such transistor from damage. For example, an output transistor of an audio amplifier can be exposed to excessive power dissipation under various combinations of input signal and output load conditions. Also, transistors employed in a voltage regulator can be exposed to excessive power dissipation under various combinations of unregulated input voltage and output load conditions.

It is known in the art to limit the maximum power dissipation in an output transistor by monitoring the instantaneous power and providing degenerative feedback so as to prevent the power dissipation from exceeding a predetermined limit. In particular, output current $I_O$ is sensed by a current sensing resistor inserted in series with the collector-emitter path of the output transistor. The collector-emitter voltage $V_{CE}$ is sensed and multiplied by $I_O$ to obtain a product representing the instantaneous power dissipation. The product is compared to the predetermined limit. If the limit is exceeded, a feedback signal is applied to reduce the power dissipation. The latter may be accomplished, for example, by diverting signal current drive from the base electrode of the output transistor. A disadvantage of the prior art power limiting approach described above is that the use of a current sensing resistor reduces the available output voltage, and therefore the available output power. Moreover, circuits for obtaining the product of two analog quantities tend to be complex.

SUMMARY OF THE INVENTION

The invention is embodied in a protection apparatus for a protected circuit wherein power dissipation is limited to a value related to the product of a current and a voltage associated with the protected circuit. Specifically, a first current related to the current in the principal current conduction path of the protected circuit, and a second current related to the voltage across the principal current conduction path of the protected circuit are processed by forward biasing respective first and second semiconductor junctions, to produce first and second voltages which are logarithmically related to the respective first and second currents. The first and second voltages are added together to form a voltage sum. The latter voltage sum of logarithmic terms, which is proportional to the logarithm of the product of such terms, is compared by a comparator to a reference bias potential. The output indication of the comparator is applied as a degenerative feedback signal to reduce the power dissipation in the protected transistor if the bias potential is exceeded.

DETAILED DESCRIPTION OF THE INVENTION

Figure 1:
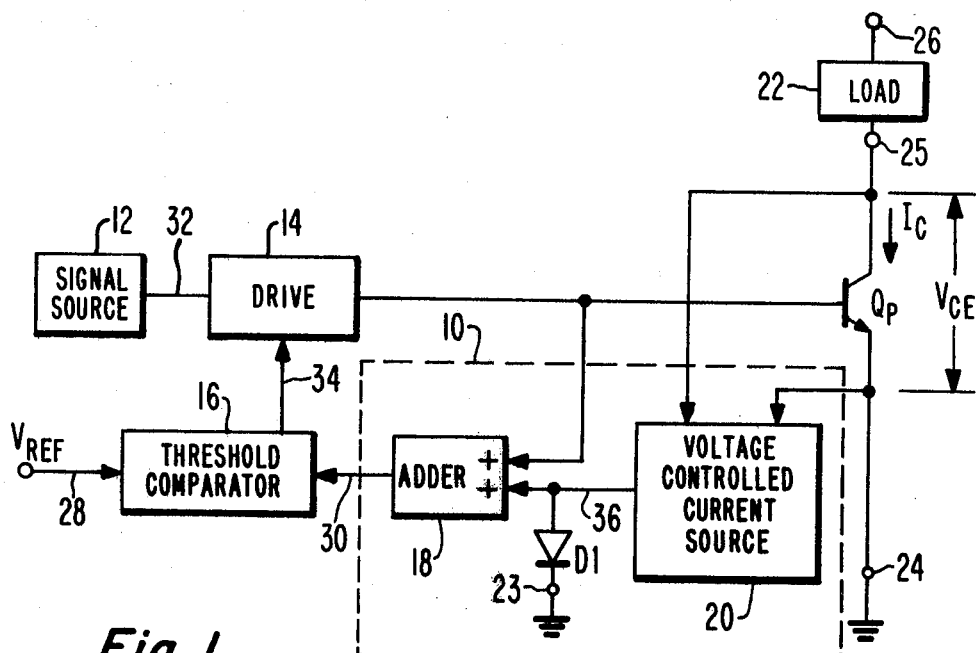
FIGS. 1, 2, and 3 are each schematic diagrams, partially block form, embodying the present invention.

FIG. 1 shows a basic amplifier comprising a signal source 12, a driver stage 14, a protected transistor $Q_P$, and an output load 22. Terminals 24 and 26 are connected to suitable sources of operating potential. The protection apparatus comprises an apparatus 10 for providing the logarithm of a product of an output current and voltage of protected transistor $Q_P$, apparatus 10 including a voltage controlled current source 20, a diode D1, and an adder 18. A threshold comparator 16 is provided for comparing the logarithm of the product to a limit value.

The voltage controlled current source 20 is responsive to the respective potentials at the collector and emitter electrodes of transistor $Q_P$ for producing an output current through conductor 36 and diode D1 proportionally related to the collector-emitter voltage, $V_{CE}$, of transistor $Q_P$. The potential across diode D1, which is substantially proportional to the logarithm of current therethrough, is therefore proportionally related to the logarithm of $V_{CE}$. The forward bias base-emitter voltage $V_{BE}$ of transistor $Q_P$ is proportionally related to the logarithm of emitter current therethrough. The adder 18 provides the sum of the forward bias voltage of diode D1 and the $V_{BE}$ of transistor $Q_P$ on conductor 30. Assuming that the collector current $I_C$ of transistor $Q_P$ is approximately equal to its emitter current $I_E$, then the output voltage of the adder 18 is substantially proportional to the logarithm of instantaneous power dissipation ($I_C \times V_{CE}$) of transistor $Q_P$. Threshold comparator 16 compares the voltage sum on conductor 30 to a reference potential $V_{REF}$ supplied on conductor 28, and if such voltage sum exceeds $V_{REF}$, a degenerative feedback signal is applied through conductor 34 to driver stage 14 so as to reduce the base drive available to transistor $Q_P$ from driver stage 14.

Figure 2:
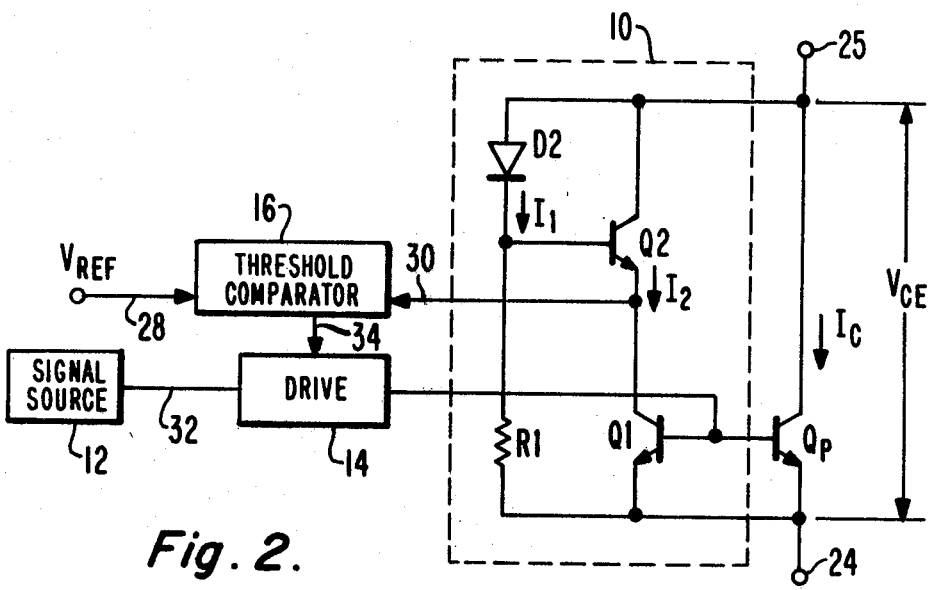

FIG. 2 shows a more specific embodiment of the apparatus 10 for providing the logarithm of the output current and voltage of a protected transistor $Q_P$ comprising transistors Q1, Q2, diode D2, and resistor R1.

Diode D2 and resistor R1 are connected in series across the collector-emitter path of transistor $Q_P$. As a result, current $I_1$ is related to the collector-emitter voltage of transistor $Q_P$. Assuming that the base current of transistor Q2 is small enough to be neglected, then current $I_1$ through diode D2 is $(V_{CE}-0.6)/R1$, where 0.6 volts is the approximate forward bias voltage drop across the diode D2. For values of $V_{CE}$ much greater than 0.6 volts, $I_1$ is approximately equal to $V_{CE}/R1$. Since $I_1$ is the current through the semiconductor junction D2, the voltage across diode D2 is proportional to the logarithm of $I_1$, i.e., the logarithm of $V_{CE}/R1$.

Transistors Q1 and $Q_P$, which have transfer characteristics which match and track each other, are arranged as a current mirror. Specifically, since the $V_{BE}$ of transistor $Q_P$ is equal to the $V_{BE}$ of Q1, the ratio of the collector current of Q1 ($I_2$) is proportionally related to the collector current of $Q_P$ ($I_C$) in the same proportion as the ratio of their respective emitter-based junction areas. For simplicity, it is assumed herein that all emitter-base junction area ratios are unity.

The collector current of transistor Q1 is the emitter current, $I_2$, of transistor Q2. Since $I_2$ is the current through a semiconductor junction embodied in transistor Q2, the $V_{BE}$ of transistor Q2 is proportional to the logarithm of $I_2$, i.e., the logarithm of $I_C$.

The sum of the voltages across diode D2 and the $V_{BE}$ of transistor Q2, measured with respect to the potential on terminal 25, is available on conductor 30. Since the voltage drop across a semiconductor junction is proportionally related to the logarithm of the respective currents $I_1$, $I_2$ therethrough, the sum of the respective semiconductor junction voltages on conductor 30 represents the logarithm of the product of such respective currents $I_1$, $I_2$. Since $I_1$ and $I_2$ are approximately proportional to $V_{CE}/R1$ and $I_C$ respectively, the voltage on conductor 30 (with respect to terminal 25) is proportional to the logarithm of $(I_C \times V_{CE})/R1$ to a first approximation.

Figure 3:
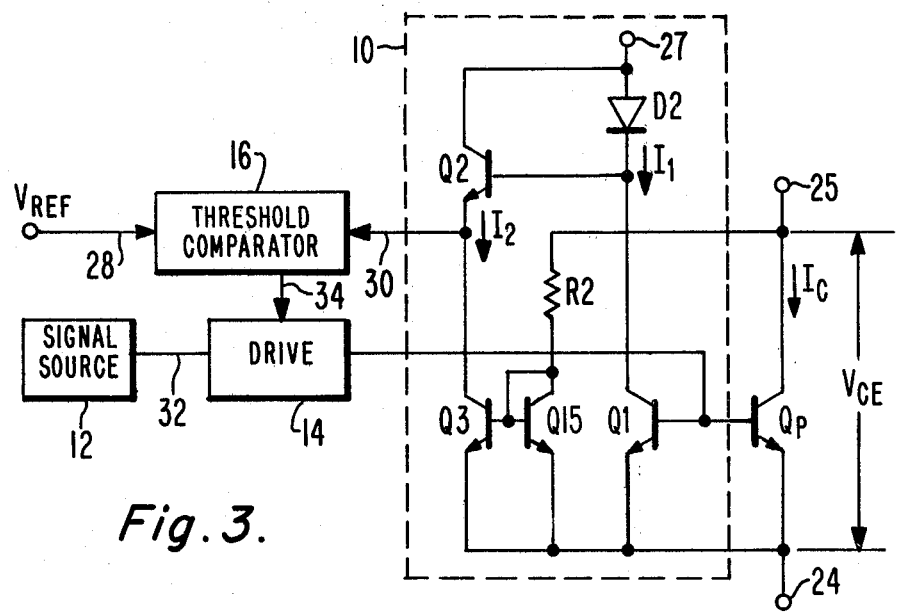

Another embodiment of the apparatus 10 for providing the logarithm of an output current and voltage of a protected transistor $Q_P$ is shown in FIG. 3.

Diode-connected transistor Q15 and resistor R2 are connected in series across the collector-emitter path of transistor $Q_P$. As a result, the current transistor Q15 is related to the collector-emitter voltage of $Q_P$. Specifically, the current through transistor Q15 is $(V_{CE}-0.6)/R2$, where 0.6 volts is the approximate forward bias voltage drop across diode-connected transistor Q15. For values of $V_{CE}$ much greater than 0.6 volts, the current through Q15 is approximately equal to $V_{CE}/R2$. Transistors Q3 and Q15 are arranged as a current mirror amplifier so that the collector current of Q3 is proportional to the collector current of Q15, i.e., proportional to $V_{CE}/R2$. Since the collector current of Q3 is also the emitter current, $I_2$, of transistor Q2, the $V_{BE}$ of transistor Q2 is proportional to the logarithm of $I_2$, i.e., the logarithm of $V_{CE}/R2$.

Transistors Q1 and $Q_P$ are arranged as a current mirror. The collector current of transistor Q1 is proportionally related to the collector current $I_C$ of $Q_P$. Assuming that the base current of transistor Q2 can be neglected, then the current $I_1$ through diode D2 is proportional to $I_C$. Since $I_1$ is the current through the semiconductor junction D2, the voltage across D2 is proportional to the logarithm of $I_1$, i.e., the logarithm of $I_C$.

The sum of the voltages across diode D2 and the $V_{BE}$ of transistor Q2, measured with respect to the potential on terminal 27, is available on conductor 30. Terminal 27, at the interconnection of diode D2 and the collector electrode of transistor Q2, may be connected to load terminal 25 as in FIG. 2, or to a separate source of operating potential. Since $I_1$ and $I_2$ are approximately proportional to $I_C$ and $V_{CE}/R2$ respectively, the voltage on conductor 30 is proportional to the logarithm of $(I_C \times V_{CE})/R2$ to a first approximation.

Figure 4:
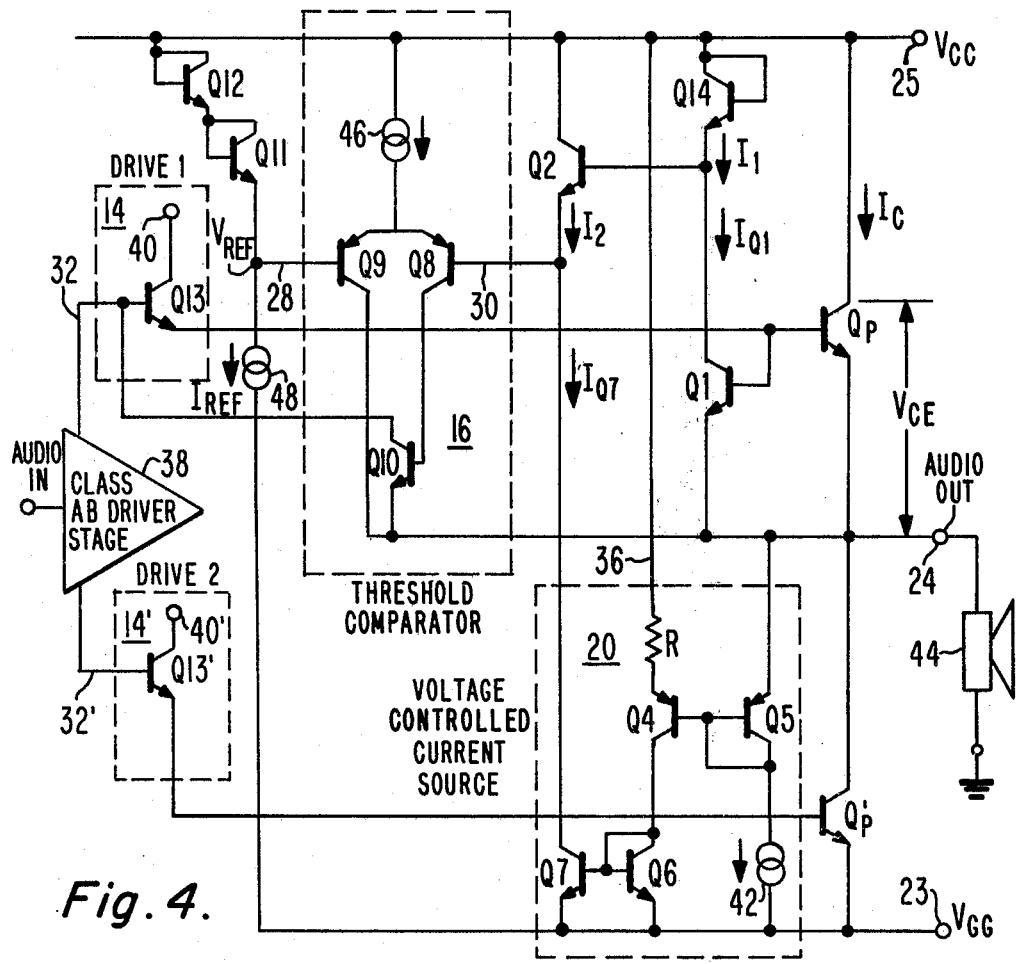
FIG. 4 is a schematic diagram illustrating a class AB push pull audio amplifier embodying the present invention.

FIG. 4 shows a power protection circuit in accordance with the invention embodied in a class AB push-pull audio amplifier. An audio signal is supplied to the audio input terminal of a class AB push-pull drive stage 38. The push-pull outputs 32, 32' of driver 38 are supplied to respective drivers 14, 14' which use respective transistors Q13, Q13' in emitter follower configuration. Transistors Q13, Q13' are connected to supply push-pull base current drive to respective power output transistors $Q_P$, $Q_P'$. The collector electrodes of transistors Q13, Q13' are connected to a source of operating potential at terminal 40. The collector electrode of $Q_P$ is connected to terminal 25, which receives a positive operating potential $V_{CC}$. The emitter electrode of $Q_P'$ is connected to terminal 23, which receives a negative operating potential $V_{GG}$. The speaker output load 44 is connected to the audio output terminal 24, at the interconnection of the emitter electrode of transistor $Q_P$ and the collector electrode of transistor $Q_P'$. The other end of the speaker load 44 is connected to ground potential.

FIG. 4 shows a protection circuit for transistor $Q_P$ only. However, it will be understood that a second or similar protection circuit will normally be provided to protect the other push-pull output transistor $Q_P'$.

Transistors Q1, Q14, and Q2 operate to provide the logarithm of two factors proportional to $I_C$ and $V_{CE}$ respectively. Mirroring transistor Q1 provides an output current $I_{Q1}$ proportionally related to $I_C$. Voltage controlled current source 20 provides an output current $I_{Q7}$ on conductor 36 proportionally related to $V_{CE}$. Voltage controlled current source 20 comprises transistors Q4, Q5, Q6, Q7, resistor R and current source 42. Diode-connected transistor Q5 is forward biased by current source 42 to provide a voltage drop, $V_{BE}$, between the emitter electrode of $Q_P$ and the base electrode of transistor Q4. The $V_{BE}$ of transistor Q4 is assumed to be substantially equal to the $V_{BE}$ of transistor Q5. Since the respective emitter-base voltages of transistors Q4 and Q4 are subtracted from each other, the potential across resistor R is substantially equal to $V_{CE}$. The current through resistor R is then substantially equal to $V_{CE}/R$. The current through resistor R also flows through transistor Q6 due to conduction by transistor Q4. Transistors Q6 and Q7 are connected as a current mirror amplifier so that the collector current output of Q7, $I_{Q7}$, is also proportionally related to the collector current of Q6, and therefore proportionally related to $V_{CE}/R$.

Transistors Q14 and Q2 convert currents $I_{Q1}$ and $I_{Q7}$ respectively into a voltage related to the logarithm of respective currents. The emitter current $I_1$ of diode-connected transistor Q14 is substantially equal to $I_{Q1}$, which is proportional to $I_C$. The emitter current $I_2$ of transistor Q2 is substantially equal to $I_{Q7}$, which is proportional to $V_{CE}/R$. Therefore, the voltage on conductor 30, measured with respect to the potential on terminal 25, is the sum of the respective base-emitter voltages of transistors Q14 and Q2, which voltage sum is proportional to the logarithm of $(I_C \times V_{CE})/R$ to a first approximation.

Threshold comparator 16 compares the voltage on conductor 30 to that on conductor 28. Since one input on conductor 30 to the threshold comparator 16 represents the logarithm of a product, the other input, $V_{REF}$ is a bias potential on conductor 28 which represents the logarithm of a desired limit for such product.

$V_{REF}$ is provided by diode-connected transistors Q11 and Q12 in series with a constant current source 48. The voltage across Q11, as well as the voltage across Q12, is proportional to the logarithm of current $I_{REF}$ therethrough from source 48. The sum of the voltage across Q11 and Q12 on conductor 28, measured with respect to the potential on terminal 25, is therefore proportional to the logarithm of $I_{REF}^2$. The inputs to comparator 16 on conductors 28 and 30 will then be equal when $I_{REF}^2 R = V_C \times I_{CE}$.

It has been noted that the voltage across a semiconductor is proportional to the logarithm of the current therethrough. It is also noted that such voltage is proportional to temperature. However, as long as the temperature factor equally affects both inputs to the comparator 16, the effect of temperature variation will be cancelled. Towards this end, the semiconductor junctions Q11 and Q12 which provide one input to the comparator are held at substantially the same temperature as the semiconductor junctions Q2, Q14 which provide the other input to the comparator.

Threshold comparator 16 comprises current source 46, transistors Q8, Q9 arranged as an emitter coupled differential amplifier, and an output transistor Q10. Output transistor Q10 diverts current from driver stage 14 when the potential difference between the inputs on conductors 30 and 28 to the threshold comparator 16 is positive.

When the power level in $Q_P$ exceeds a predetermined limit, transistor Q8 conducts current which forward biases Q10. Current drawn through the collector of Q10 reduces base drive to Q13 and therefore reduces base drive to $Q_P$. When the power level does not exceed the predetermined limit, the operation of transistors Q13 and $Q_P$ are substantially unaffected by the protection circuit.

It can be seen that by adjustment of $I_{REF}$ and R, or by selection of emitter-base junction area ratios other than unity, a desired predetermined power limit can be achieved. The predetermined power limit can be selected to correspond to the permissible maximum power dissipation.

Alternatively, it may be desirable to limit the power dissipation of the protected transistor to the so-called safe operating area (SOA) rating rather than to the maximum power dissipation. The boundary curve for the safe operating area differs from a curve of maximum power dissipation primarily in the region of higher values of $V_{CE}$. At higher values of $V_{CE}$, secondary breakdown factors tend to reduce the maximum power dissipation possible. If the range of operation is limited to a constant maximum power dissipation rather than to the SOA region, then the protection circuit may limit the useful range of operation of the transistor, namely the maximum power which can be dissipated by it.

By adding or subtracting a constant from the $V_{CE}$ or $I_C$ factor, and by appropriate adjustment of circuit parameters, such as R and $I_{REF}$, it is possible to shift the resulting curve of maximum power dissipation away from a curve of constant power dissipation in a direction towards the SOA rating characteristic, thereby more fully utilizing the power dissipation capability of the protected transistor.

The following and other modifications are intended to be within the scope of the present invention as defined by the claims.

There are alternate ways to obtain the voltage sum of forward biased semiconductor junctions which represent the logarithm of a product. Particularly, the $V_{BE}$ of transistor $Q_P$ may be used directly as a voltage logarithmically related to $I_C$. For example, a single additional transistor of opposite conductivity type to that of transistor $Q_P$ may be connected at the base electrode thereof to the base electrode $Q_P$, and connected at the emitter electrode thereof through a resistor R to the collector electrode of $Q_P$. The collector electrode of the additional transistor is returned to a convenient source of operating potential. The emitter current of the single additional transistor is proportional to $V_{CE}$ minus two forward-biased base emitter voltage drops (about 1.2 volts) divided by R. The potential from the emitter electrode of the additional transistor to the emitter electrode of $Q_P$ is the sum of their respective base-emitter voltages, which sum is proportionally related to the logarithm of $I_C \times (V_{CE} - 1.2 \text{ volts})/R$.

In the embodiment shown, the logarithm of a product is compared to a reference potential. It will be appreciated, however, that the anti-logarithm of such product may be obtained by applying the voltage sum of logarithms to the emitter-base junction of another transistor. The collector current of such other transistor is then directly proportional to the product of terms, which product may then be compared to a separate reference potential.

It is also noted that instantaneous power limiting is not always desirable. For example, rather than limit power dissipation instantaneously, one can integrate a term representing power dissipation with time and apply degenerative feedback if the time intergral of power dissipation exceeds a predetermined limit. The latter arrangement permits longer than excursions for conditions of slightly excessive power dissipation, but only shorter time excursions for greatly excessive power dissipation conditions.

Current source 48 which provides $I_{REF}$ may be arranged to provide a current which is a function of temperature. In such case, the maximum power dissipation should be made to decrease for increasing temperature. Current source 48 can also be arranged to provide thermal shutdown of the amplifier at a predetermined temperature by sharply reducing $I_{REF}$ at such predetermined temperature.

What is claimed is:

1. In an arrangement including a protected transistor having collector, base and emitter electrodes, said base electrode receiving a drive signal and in response an output voltage developing between said collector and emitter electrodes and an output current flowing in the conduction path between said collector and emitter electrodes, a power protection circuit comprising:
   a first semiconductor junction;
   means responsive to said output voltage for forward biasing said first semiconductor junction to develop a first voltage which is logarithmically related to said output voltage;
   the base-emitter junction of said protected transistor being responsive to said output current for developing a second voltage thereacross which is logarithmically related to said output current;
   means for adding said first and second voltages to produce their sum; and
   control means for reducing said drive signal when said sum of said first and second voltages exceeds a predetermined limit.

2. In an arrangement including a protected transistor having collector, base and emitter electrodes, said base electrode receiving a drive signal and in response an output voltage being developed between said collector and emitter electrodes and an output current flowing in the conduction path between said collector and emitter electrodes, a power protection circuit comprising:
   first and second semiconductor junctions;
   means responsive to said output voltage for forward biasing said first semiconductor junction to develop a first voltage which is logarithmically related to said output voltage;
   a second transistor having collector, base and emitter electrodes, said base and emitter electrodes of said second transistor being connected to said base and emitter electrodes, respectively, of said protected transistor to produce a current flowing through the conduction path between said collector and emitter electrodes of said second transistor which is substantially proportional to said output current, said collector electrode of said second transistor being connected to said second semiconductor junction to forward bias it to develop a second voltage which is logarithmically related to said current flowing through said conduction path of said second transistor and thereby logarithmically related to said output current;

means for providing the sum of said first and second voltages; and control means for reducing said drive signal when said sum of said first and second voltages exceeds a predetermined limit.

3. A power protection circuit according to claim 2, wherein:

said first semiconductor junction comprises a diode having first and second electrodes; and said means responsive to said output voltage of said first transistor comprises a resistor connected between said emitter electrode of said protected transistor and said first electrode of said diode, said second electrode of said diode being connected to the collector electrode of said protected transistor.

4. A power protection circuit according to claim 3 further comprising a third transistor having collector, base, and emitter electrodes, wherein:

said collector-emitter conduction path of said second transistor is connected in series with the conduction path between said collector and emitter electrodes of said third transistor, said second semiconductor junction comprising the base-emitter junction of said third transistor; and said means for providing the sum of said first and second voltages comprises a connection between the first electrode of said diode and said base electrode of said third transistor so that said diode and said base-emitter junction of said third transistor are connected in series with the same polarity whereby the sum of said first and second voltages is produced at said emitter electrode of said third transistor, said emitter electrode of said third transistor being connected to said control means.

5. A power protection circuit according to claim 2 wherein:

said second semiconductor junction comprises a diode connected in series with said collector-emitter conduction path of said second transistor; and said means responsive to said output voltage of said protected transistor comprises a current mirror amplifier having input, output and common electrodes; and a resistor connected between said collector electrode of said protected transistor and said input electrode of said current mirror amplifier, said common electrode of said current mirror amplifier being connected to said emitter electrode of said protected transistor, said output of said current mirror amplifier being connected to said first semiconductor junction.

6. A power protection circuit according to claim 5 further comprising a third transistor having collector, base, and emitter electrodes, wherein:

said conduction path between said collector and emitter electrodes of said third transistor is connected to said output electrode of said current mirror amplifier;

said first semiconductor junction comprising the base-emitter junction of said third transistor; and said means for providing the sum of said first and second voltages comprises means for connecting said diode and said base-emitter junction of said third transistor in series with the same polarity whereby the sum of said first and second voltages is produced at said emitter electrode of said third transistor, the emitter electrode of said third transistor being connected to said control means.

7. A power protection circuit according to claim 4 or claim 6 wherein said first semiconductor junction is a diode-connected transistor.

8. A power protection circuit according to claim 1 or 2, wherein said drive signal is an audio frequency signal and further including:

a speaker; and means for coupling said output current to said speaker.

9. In an arrangement including a protected transistor having collector, base and emitter electrodes, said base electrode receiving a drive signal and in response an output voltage developing between said collector and emitter electrodes and an output current flowing in the conduction path between said collector and emitter electrodes, a power protection circuit comprising:

first and second semiconductor junctions;

means responsive to said output voltage for forward biasing said first semiconductor junction to develop a first voltage which is logarithmically related to said output voltage;

means responsive to said output current for forward biasing said second semiconductor junction to develop a second voltage which is logarithmically related to said output current;

means for adding said first and second voltages to produce the sum of said first and second voltages;

third and fourth semiconductor junctions;

means for thermally coupling said first, second, third and fourth semiconductor junctions so that their respective temperatures match and track each other;

means for forward biasing said third and fourth semiconductor junctions;

means for adding the forward bias voltage drops of said third and fourth semiconductor junctions to form a reference bias potential; and comparator means responsive to said sum of said first and second voltages and said reference bias potential for reducing said drive signal when said sum is greater than said reference potential.

* * * * *